(12) United States Patent
Feng

(10) Patent No.: US 11,145,698 B2
(45) Date of Patent: Oct. 12, 2021

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Xiaoliang Feng, Wuhan (CN)

( * ) Notice: Subject to any disclaimer, the term of this patent is extended or adjusted under 35 U.S.C. 154(b) by 354 days.

(21) Appl. No.: 16/343,781

(22) PCT Filed: Jan. 3, 2019

(86) PCT No.: PCT/CN2019/070210
§ 371 (c)(1),
(2) Date: Apr. 22, 2019

(87) PCT Pub. No.: WO2020/118806
PCT Pub. Date: Jun. 18, 2020

(65) Prior Publication Data
US 2021/0183969 A1 Jun. 17, 2021

(30) Foreign Application Priority Data

Dec. 12, 2018 (CN) .......................... 201811520847.7

(51) Int. Cl.
*H01L 27/32* (2006.01)
*H01L 51/52* (2006.01)

(52) U.S. Cl.
CPC ...... *H01L 27/3246* (2013.01); *H01L 27/3258* (2013.01); *H01L 51/5253* (2013.01); *H01L 51/5259* (2013.01)

(58) Field of Classification Search
CPC ............. H01L 27/3246; H01L 27/3283; H01L 27/3295; H01L 27/3258; H01L 51/5259; H01L 51/5253
See application file for complete search history.

(56) References Cited

U.S. PATENT DOCUMENTS

| | | | |
|---|---|---|---|
| 2003/0146692 A1* | 8/2003 | Uchida | ................... H01L 51/56 313/504 |
| 2005/0140285 A1 | 6/2005 | Park et al. | |
| 2012/0181525 A1* | 7/2012 | Sugimoto | ........... H01L 27/3258 257/40 |
| 2015/0060822 A1* | 3/2015 | Kamiya | ............. H01L 51/5225 257/40 |

(Continued)

FOREIGN PATENT DOCUMENTS

| | | |
|---|---|---|
| CN | 100435348 C | 11/2008 |
| CN | 102511199 A | 6/2012 |

(Continued)

*Primary Examiner* — Errol V Fernandes
*Assistant Examiner* — Jeremy J Joy

(57) ABSTRACT

A display panel and a display device are provided. The display panel has an array substrate, a planarization layer, an anode layer, a light emitting device layer having light emitting device units, a plurality of pixel defining bodies, and a plurality of blocking walls disposed between the neighboring light emitting device units for blocking water and oxygen. Each of the blocking walls contacts with at least one of the planarization layer and the anode layer, and an upper surface of one of the blocking walls is not lower than an upper surface of one of the pixel defining bodies.

8 Claims, 2 Drawing Sheets

(56) References Cited

U.S. PATENT DOCUMENTS

| | | | |
|---|---|---|---|
| 2015/0372256 A1* | 12/2015 | Jiao | H01L 51/5259 |
| | | | 257/40 |
| 2016/0079324 A1 | 3/2016 | Go et al. | |
| 2019/0123116 A1* | 4/2019 | Wang | H01L 27/3283 |
| 2020/0274083 A1* | 8/2020 | Guo | H01L 51/5253 |

FOREIGN PATENT DOCUMENTS

| | | | | |
|---|---|---|---|---|
| CN | 105810716 A | * | 7/2016 | |
| CN | 105810716 A | | 7/2016 | |
| CN | 107113937 A | | 8/2017 | |
| CN | 107579166 A | | 1/2018 | |
| CN | 107819080 A | | 3/2018 | |
| CN | 108232036 A | * | 6/2018 | |
| CN | 108232036 A | | 6/2018 | |
| CN | 108511621 A | * | 9/2018 | |
| KR | 20090132723 A | * | 12/2009 | |
| WO | WO-2019041899 A1 | * | 3/2019 | H01L 27/32 |

* cited by examiner

DISPLAY PANEL AND DISPLAY DEVICE

FIELD OF DISCLOSURE

The present disclosure relates to displays, and more particularly, to a display panel and a display device.

BACKGROUND OF DISCLOSURE

It is known that organic light emitting diodes (OLEDs) have received great attention from academia and industry for their wide application in fields of solid-state lighting and flat panel display lamps.

Organic luminescent materials are very sensitive to water and oxygen. Therefore, how to effectively isolate damage of external water and oxygen to organic light emitting devices to ensure a long service life of the devices is also one of the highlights and difficulties in a research of current display panels. At present, a relatively mature packaging process is generally realized by an inorganic/organic multiple alternating film structure, where a main function of an inorganic layer is to block water and oxygen. A main function of an organic layer is to relieve stress between adjacent inorganic layers when the display panels are bent. However, a current packaging structure does not fully realize blocking the water and oxygen of organic light emitting devices, resulting in a problem of low yield of the existing products.

Therefore, there is a need for a display panel and a display device to solve the above problems.

SUMMARY OF DISCLOSURE

The present disclosure provides a display panel and a display device to solve a problem that a light emitting device in the display panel is easily corroded by water and oxygen.

In order to solve the above problem, a technical solution provided by the present disclosure is as follows:

According to an aspect of the present disclosure, a display panel is provided and includes:
   an array substrate;
   a planarization layer disposed on the array substrate;
   an anode layer disposed on the planarization layer;
   a light emitting device layer disposed on the anode layer and comprising light emitting device units distributed at intervals;
   a plurality of pixel defining bodies, each being disposed between the neighboring light emitting device units; and
   a plurality of blocking walls, each being disposed between the neighboring light emitting device units for blocking water and oxygen,
wherein each of the blocking walls contacts with at least one of the planarization layer and the anode layer, and an upper surface of one of the blocking walls is not lower than an upper surface of one of the pixel defining bodies.

In a display panel of the present disclosure, fabricating material of the blocking walls comprises an inorganic material.

In a display panel of the present disclosure, at least one of the blocking walls is disposed between the neighboring light emitting device units.

In a display panel of the present disclosure, the blocking walls are disposed inside the pixel defining bodies.

In a display panel of the present disclosure, n numbered blocking walls are disposed inside each of the pixel defining bodies, where n is a positive integer, wherein each of the pixel defining bodies is divided into n+1 numbered pixel defining units by the blocking walls, and the pixel defining units are separated from each other.

In a display panel of the present disclosure, each of the blocking walls is disposed between one of the light emitting device units and one of the pixel defining bodies and covers a side surface of one of the pixel defining bodies.

In a display panel of the present disclosure, the display panel further comprises a first blocking wall and a second blocking wall disposed between the neighboring light emitting device units, wherein the first blocking wall is disposed inside one of the pixel defining bodies, and the second blocking wall is disposed between one of the pixel defining bodies and one of the light emitting device units and covers a side surface of one of the pixel defining bodies.

In a display panel of the present disclosure, the display panel further comprises a cathode layer covering the pixel defining bodies, the blocking walls, and the light emitting device layer.

In a display panel of the present disclosure, fabricating materials of the planarization layer and the blocking walls both comprise silicon nitride, and the planarization layer and the blocking walls are fabricated in a same mask process.

According to another aspect of the present disclosure, a display device is provided and includes a touch layer and a display panel. The display panel comprises:
   an array substrate;
   a planarization layer disposed on the array substrate;
   an anode layer disposed on the planarization layer;
   a light emitting device layer disposed on the anode layer and comprising light emitting device units distributed at intervals;
   a plurality of pixel defining bodies, each being disposed between the neighboring light emitting device units; and
   a plurality of blocking walls, each being disposed between the neighboring light emitting device units for blocking water and oxygen,
   wherein each of the blocking walls contacts with at least one of the planarization layer and the anode layer, and an upper surface of one of the blocking walls is not lower than an upper surface of one of the pixel defining bodies.

In a display device of the present disclosure, fabricating material of the blocking walls comprises an inorganic material.

In a display device of the present disclosure, at least one of the blocking walls is disposed between the neighboring light emitting device units.

In a display device of the present disclosure, the blocking walls are disposed inside the pixel defining bodies.

In a display device of the present disclosure, n numbered blocking walls are disposed inside each of the pixel defining bodies, where n is a positive integer, wherein each of the pixel defining bodies is divided into n+1 numbered pixel defining units by the blocking walls, and the pixel defining units are separated from each other.

In a display device of the present disclosure, each of the blocking walls is disposed between one of the light emitting device units and one of the pixel defining bodies and covers a side surface of one of the pixel defining bodies.

In a display device of the present disclosure, each of the blocking walls at least covers the side surface of one of the pixel defining bodies.

In a display device of the present disclosure, the display panel further comprises a first blocking wall and a second blocking wall disposed between the neighboring light emitting device units, wherein the first blocking wall is disposed inside one of the pixel defining bodies, and the second blocking wall is disposed between one of the pixel defining bodies and one of the light emitting device units and covers a side surface of one of the pixel defining bodies.

In a display device of the present disclosure, the display panel further comprises a cathode layer covering the pixel defining bodies, the blocking walls, and the light emitting device layer.

In a display device of the present disclosure, fabricating materials of the planarization layer and the blocking walls both comprise silicon nitride, and the planarization layer and the blocking walls are fabricated in a same mask process.

Beneficial effects: In the present disclosure, blocking walls for blocking water and oxygen are added and disposed between adjacent light emitting device units to prevent water oxygen from diffusing in a horizontal direction inside the display panel, thereby improving the water-oxygen resistance of the display panel.

DESCRIPTION OF DRAWINGS

In order to more clearly describe embodiments of the present disclosure or technical solutions in a conventional technology, drawings required to be used for the embodiments or descriptions of the conventional technology are simply described hereinafter. Apparently, the drawings described below only illustrate some embodiments of the present disclosure. Those skilled in the art can obtain other drawings based on these drawings disclosed herein without creative effort.

DETAILED DESCRIPTION OF PREFERRED EMBODIMENTS

The following description of the embodiments with reference to the appended drawings is used for illustrating specific embodiments which may be used for carrying out the present disclosure. The directional terms described by the present disclosure, such as "upper", "lower", "front", "back", "left", "right", "inner", "outer", "side", etc. are only directions by referring to the accompanying drawings. Thus, the used directional terms are used to describe and understand the present disclosure, but the present disclosure is not limited thereto. In figures, elements with similar structures are indicated with the same numbers.

The present disclosure provides a display panel and a display device to solve a problem that a light emitting device in the display panel is easily corroded by water and oxygen.

Figure 1:
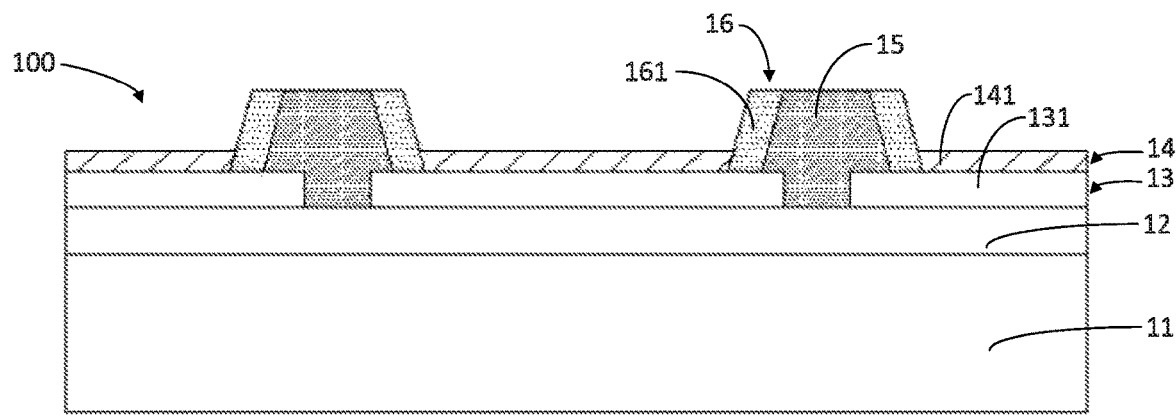
FIG. 1 is a cross-sectional diagram of a display panel provided by a first embodiment of the present disclosure.

Referring to FIG. 1, FIG. 1 is a cross-sectional diagram of a display panel 100 provided by a first embodiment of the present disclosure.

According an aspect of the present disclosure, a display panel 100 is provided and includes an array substrate 11, a planarization layer 12, an anode layer 13, a light emitting device layer 14, a plurality of pixel defining bodies 16, and a plurality of blocking walls 15.

The array substrate 11 includes a base substrate and a thin film transistor layer disposed on the base substrate.

In an embodiment, a buffering layer is disposed between the base substrate and the thin film transistor layer. Fabricating material of the buffering layer includes at least one of silicon nitride, silicon oxide, and silicon oxynitride.

In an embodiment, the thin film transistor layer comprises:

an active layer including a channel region located in the middle and a source electrode doped region and a drain electrode doped region respectively disposed at two ends of the channel region;

a first insulating layer disposed on the active layer, wherein preparation material of the first insulating layer comprises silicon nitride;

a gate metal disposed on the first insulating layer;

a gate insulating layer disposed on the gate metal; and a source electrode metal and a drain electrode metal disposed on the gate insulating layer, where the thin film transistor layer further includes a first through hole and a second through hole extending through the first insulating layer and the gate insulating layer, wherein the source electrode metal is electrically connected to the source electrode doped region through the first through hole, and the drain electrode metal is electrically connected to the drain electrode doped region through the second through hole.

The planarization layer 12 is disposed on the array substrate 11. Fabricating material of the planarization layer 12 comprises one of an organic material and an inorganic material.

A third through hole is formed in the planarization layer 12. The anode layer 13 is connected to the drain electrode metal through the third through hole.

The anode layer 13 is disposed on the planarization layer 12. The anode layer 13 includes anode metals 131 distributed at intervals.

The light emitting device layer 14 is disposed on the anode layer 13 and includes light emitting device units 141 distributed at intervals. The light emitting device units 141 are disposed on the anode metals 131.

Fabricating material of the light emitting device units 141 is water-oxygen sensitive and is highly susceptible to damage caused by water and oxygen corrosion. Therefore, it is necessary to provide a corresponding structure in the display panel 100 to perform water-oxygen isolation of the light emitting device units 141.

Each of the plurality of pixel defining bodies 16 is disposed between the neighboring light emitting device units 141 so as to define a pixel region of the array substrate 11.

The pixel defining bodies 16 are generally fabricated using an organic material that does not have characteristics of blocking water and oxygen. The external water and oxygen easily permeate into the light emitting device units 141 through the pixel defining bodies 16.

Therefore, the present disclosure provides the blocking walls 15 for blocking water and oxygen between the adjacent light emitting device units 141, such that an infiltration path of the pixel defining bodies 16 is isolated, so as to achieve blocking water and oxygen in a horizontal direction of the light emitting device units 141.

Each of the blocking walls 15 contacts with at least one of the planarization layer 12 and the anode layer 13. That is, one end of the blocking walls 15 can be disposed to cover or partially cover the anode layer 13, or one end of the blocking walls 15 can be disposed between adjacent anode units. Further, an upper surface of one of the blocking walls 15 is not lower than an upper surface of one of the pixel defining bodies 16, so as to prevent water and oxygen from infiltrating in the pixel defining body 16 and etching the light emitting device layer 14.

In one embodiment, fabricating material of the blocking walls 15 comprises an inorganic material. Compared to the pixel definition bodies 16 fabricated by an organic material, the inorganic material has a relatively high water and oxygen blocking property.

In one embodiment, at least one of the blocking walls 15 is disposed between the neighboring light emitting device units 141.

Figure 4:
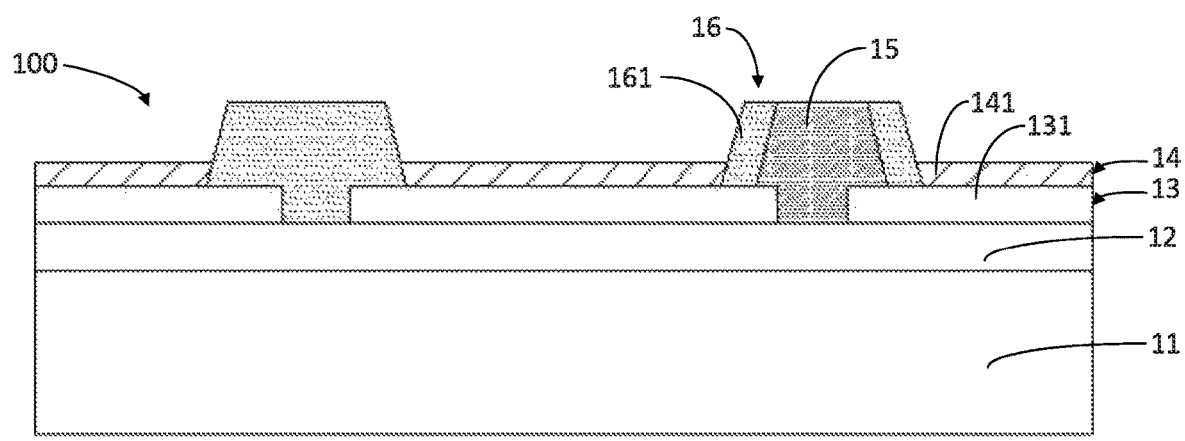
FIG. 4 is a cross-sectional diagram of a display panel provided by a fourth embodiment of the present disclosure.

Referring to FIG. 4, FIG. 4 is a cross-sectional diagram of a display panel 100 provided by a fourth embodiment of the present disclosure.

In one embodiment, the blocking walls 15 may or may not be disposed between the neighboring light emitting device units 141. Specific settings are subject to actual needs of the display panel 100.

In one embodiment, the blocking walls 15 are disposed inside the pixel defining bodies 16. In the present embodiment, the blocking walls 15 are similarly embedded in the pixel defining bodies 16, so that the blocking walls 15 have relatively good stability.

In one embodiment, n numbered blocking walls 15 are disposed inside each of the pixel defining bodies 16, where n is a positive integer, wherein each of the pixel defining bodies 16 is divided into n+1 numbered pixel defining units 161 by the blocking walls 15, and the pixel defining units 161 are separated from each other. By disposing a plurality of blocking walls 15 in each of the pixel defining bodies, multiple blocking walls can be achieved for the light emitting device layer 14 to improve a protective effect on the light emitting device layer 14.

Figure 2:
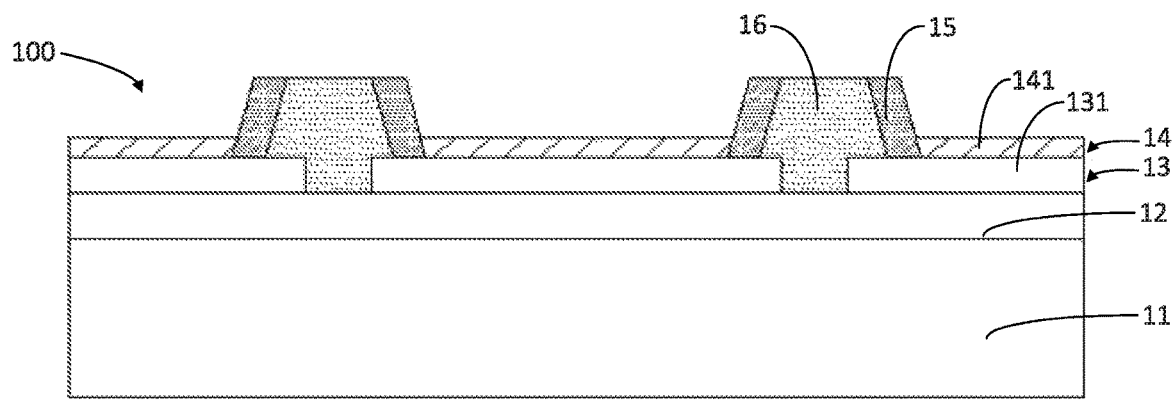
FIG. 2 is a cross-sectional diagram of a display panel provided by a second embodiment of the present disclosure.

Referring to FIG. 2, FIG. 2 is a cross-sectional diagram of a display panel 100 provided by a second embodiment of the present disclosure.

In one embodiment, each of the blocking walls 15 is disposed between one of the light emitting device units 141 and one of the pixel defining bodies 16 and covers a side surface of one of the pixel defining bodies 16.

Figure 3:
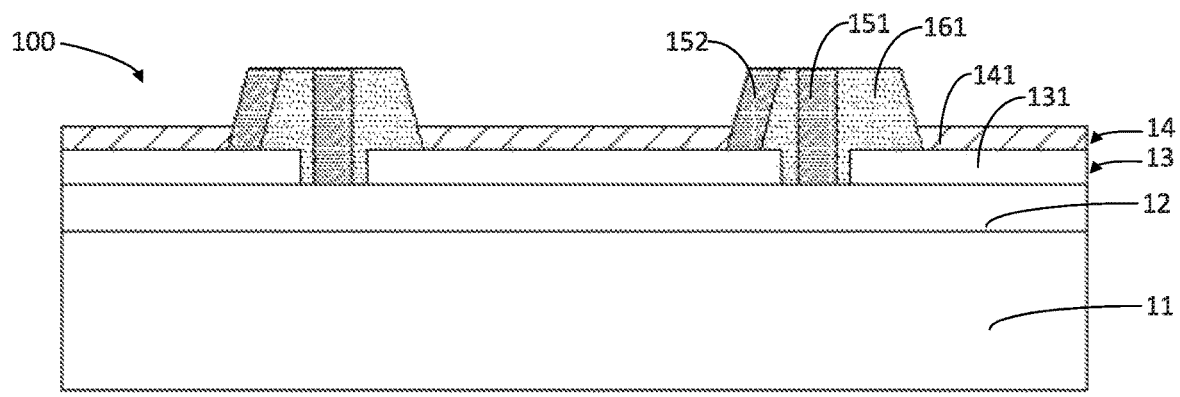
FIG. 3 is a cross-sectional diagram of a display panel provided by a third embodiment of the present disclosure.

Referring to FIG. 3, FIG. 3 is a cross-sectional diagram of a display panel 100 provided by a third embodiment of the present disclosure.

In one embodiment, a first blocking wall 151 and a second blocking wall 152 are disposed between the neighboring light emitting device units 141, wherein the first blocking wall 151 is disposed inside one of the pixel defining bodies 16, and the second blocking wall 152 is disposed between one of the pixel defining bodies 16 and one of the light emitting device units 141 and covers a side surface of one of the pixel defining bodies 16.

That is, multiple protection of the light emitting device layer 14 is achieved.

Figure 5:
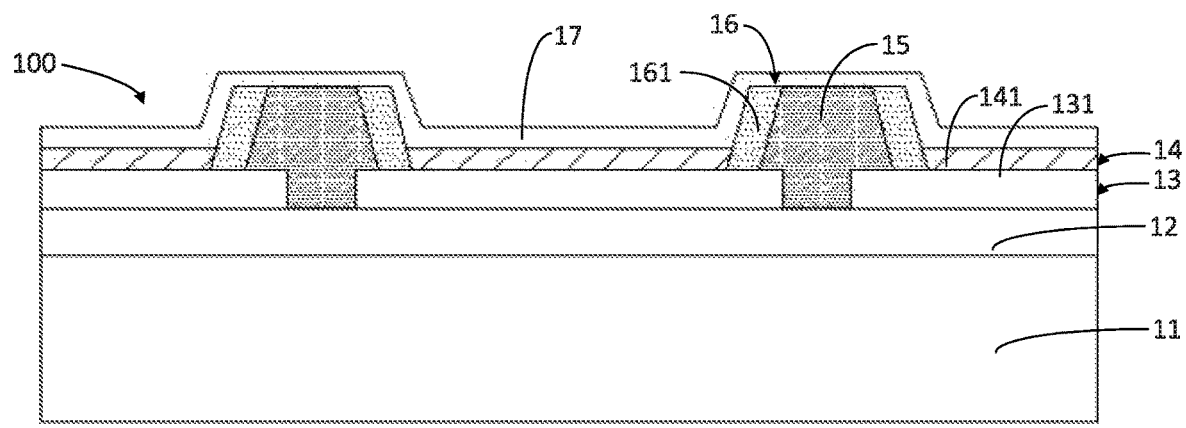
FIG. 5 is a cross-sectional diagram of a display panel provided by the fourth embodiment of the present disclosure.

Referring to FIG. 5, FIG. 5 is a cross-sectional diagram of a display panel 100 provided by a fourth embodiment of the present disclosure.

In one embodiment, the display panel 100 further comprises a cathode layer covering the pixel defining bodies 16, the blocking walls 15, and the light emitting device layer 14.

In one embodiment, the display panel 100 further includes an encapsulation layer disposed on the cathode layer.

The encapsulation layer comprises a multi-layered structure, which can be a three-layered structure of an inorganic layer/an organic layer/an inorganic layer, or a five-layered structure of an inorganic layer/an organic layer/an inorganic layer/an organic layer/an inorganic layer, which can be specifically disposed according to an actual demand of the display panel 100.

In one embodiment, fabricating material of the planarization layer 12 and the blocking walls 15 both comprise silicon nitride, and the planarization layer 12 and the blocking walls 15 are fabricated in a same mask process.

In the above embodiment, in order to achieve the fabrication of the planarization layer 12 and the blocking walls 15 in the same mask process, the fabrication of the planarization layer 12 and the blocking walls 15 are first performed, and then the fabrication of the anode layer 13 and the pixel definition bodies 16 are performed, such that the fabricated display panel 100 has a structure that the blocking walls 15 are disposed in the pixel defining bodies 16.

According to another aspect of the present disclosure, a display device is further provided and includes a display panel 100 and a touch layer, wherein the display panel 100 comprises:

an array substrate 11;
a planarization layer 12 disposed on the array substrate 11;
an anode layer 13 disposed on the planarization layer 12;
a light emitting device layer 14 disposed on the anode layer 13 and comprising light emitting device units 141 distributed at intervals;
a plurality of pixel defining bodies 16, each being disposed between the neighboring light emitting device units 141; and
a plurality of blocking walls 15, each being disposed between the neighboring light emitting device units 141 for blocking water and oxygen,
wherein each of the blocking walls 15 contacts with at least one of the planarization layer 12 and the anode layer 13, and an upper surface of one of the blocking walls 15 is not lower than an upper surface of one of the pixel defining bodies 16.

In one embodiment, fabricating material of the blocking walls 15 comprises an inorganic material.

In one embodiment, at least one of the blocking walls 15 is disposed between the neighboring light emitting device units 141.

In one embodiment, the blocking walls 15 are disposed inside the pixel defining bodies 16.

In one embodiment, n numbered blocking walls 15 are disposed inside each of the pixel defining bodies 16, where n is a positive integer, wherein each of the pixel defining bodies 16 is divided into n+1 numbered pixel defining units 161 by the blocking walls 15, and the pixel defining units 161 are separated from each other.

In one embodiment, each of the blocking walls 15 is disposed between one of the light emitting device units 141 and one of the pixel defining bodies 16 and covers a side surface of one of the pixel defining bodies 16.

In one embodiment, a first blocking wall 151 and a second blocking wall 152 are disposed between the neighboring light emitting device units 141, wherein the first blocking wall 151 is disposed inside one of the pixel defining bodies 16, and the second blocking wall 152 is disposed between one of the pixel defining bodies 16 and one of the light emitting device units 141 and covers a side surface of one of the pixel defining bodies 16.

In one embodiment, the display panel 100 further comprises a cathode layer covering the pixel defining bodies 16, the blocking walls 15, and the light emitting device layer 14.

In one embodiment, fabricating material of the planarization layer 12 and the blocking walls 15 both comprise silicon nitride, and the planarization layer 12 and the blocking walls 15 are fabricated in a same mask process.

Beneficial effects: In the present disclosure, blocking walls for blocking water and oxygen are added and disposed between adjacent light emitting device units to prevent water oxygen from diffusing in a horizontal direction inside the display panel, thereby improving the water-oxygen resistance of the display panel.

As described above, although the present disclosure has been described in preferred embodiments, they are not intended to limit the disclosure. One of ordinary skill in the art, without departing from the spirit and scope of the disclosure within, can make various modifications and variations, so the range of the scope of the disclosure is defined by the claims.

The invention claimed is:

1. A display panel, comprising:
    an array substrate;
    a planarization layer disposed on the array substrate;
    an anode layer disposed on the planarization layer;
    a light emitting device layer disposed on the anode layer and comprising light emitting device units distributed at intervals;
    a plurality of pixel defining bodies, each being disposed between the neighboring light emitting device units; and
    a plurality of blocking walls, each being disposed between the neighboring light emitting device units for blocking water and oxygen, wherein the plurality of blocking walls comprise a first blocking wall and a second blocking wall disposed between the neighboring light emitting device units,
    wherein each of the blocking walls contacts with at least one of the planarization layer and the anode layer, and an upper surface of one of the blocking walls is not lower than an upper surface of one of the pixel defining bodies, and
    wherein the first blocking wall is disposed inside one of the pixel defining bodies, and the second blocking wall is disposed between one of the pixel defining bodies and one of the light emitting device units and covers a side surface of one of the pixel defining bodies.

2. The display panel according to claim 1, wherein fabricating material of the blocking walls comprises an inorganic material.

3. The display panel according to claim 1, further comprising a cathode layer covering the pixel defining bodies, the blocking walls, and the light emitting device layer.

4. The display panel according to claim 1, wherein fabricating material of the planarization layer and the blocking walls both comprise silicon nitride, and the planarization layer and the blocking walls are fabricated in a same mask process.

5. A display device, comprising a touch layer and a display panel, wherein the display panel comprises:
    an array substrate;
    a planarization layer disposed on the array substrate;
    an anode layer disposed on the planarization layer;
    a light emitting device layer disposed on the anode layer and comprising light emitting device units distributed at intervals;
    a plurality of pixel defining bodies, each being disposed between the neighboring light emitting device units; and
    a plurality of blocking walls, each being disposed between the neighboring light emitting device units for blocking water and oxygen, wherein the plurality of blocking walls comprise a first blocking wall and a second blocking wall disposed between the neighboring light emitting device units,
    wherein each of the blocking walls contacts with at least one of the planarization layer and the anode layer, and an upper surface of one of the blocking walls is not lower than an upper surface of one of the pixel defining bodies, and
    wherein the first blocking wall is disposed inside one of the pixel defining bodies, and the second blocking wall is disposed between one of the pixel defining bodies, and one of the light emitting device units and covers a side surface of one of the pixel defining bodies.

6. The display device according to claim 5, wherein fabricating material of the blocking walls comprises an inorganic material.

7. The display device according to claim 5, wherein the display panel further comprises a cathode layer covering the pixel defining bodies, the blocking walls, and the light emitting device layer.

8. The display device according to claim 5, wherein fabricating material of the planarization layer and the blocking walls both comprise silicon nitride, and the planarization layer and the blocking walls are fabricated in a same mask process.

* * * * *